(12) United States Patent
Takeda et al.

(10) Patent No.: US 6,581,840 B2
(45) Date of Patent: Jun. 24, 2003

(54) SHEET-FRAMED IC CARRIER AND METHOD FOR PRODUCING THE SAME (75) Inventors: Mitsunori Takeda, Shinjuku-Ku (JP); Eiichi Igarashi, Shinjuku-Ku (JP); Hideyo Yoshida, Shinjuku-Ku (JP)

(73) Assignee: Dai Nippon Printing Co., Ltd. (JP)

( * ) Notice: Subject to any disclaimer, the term of this patent is extended or adjusted under 35 U.S.C. 154(b) by 0 days.

(21) Appl. No.: 09/967,973

(22) Filed: Oct. 2, 2001

(65) Prior Publication Data
US 2002/0007554 A1 Jan. 24, 2002

Related U.S. Application Data (62) Division of application No. 09/099,395, filed on Jun. 18, 1998.

(30) Foreign Application Priority Data

Jun. 23, 1997 (JP) .............................. 9-180286

(51) Int. Cl.[7] .............................................. G06K 19/02
(52) U.S. Cl. ...................... 235/488; 235/492; 361/737; 257/679
(58) Field of Search ................................. 235/487, 488, 235/492; 361/736, 737, 750, 751, 764; 29/832, 837; 174/259, 260; 257/679, 680

(56) References Cited

U.S. PATENT DOCUMENTS

| 4,855,583 A | * | 8/1989 | Fraser et al. | 235/492 |
|---|---|---|---|---|
| 5,027,190 A | | 6/1991 | Haghiri-Tehrani et al. | 357/74 |
| 5,098,751 A | | 3/1992 | Tamura et al. | 428/35.8 |
| 5,173,840 A | | 12/1992 | Kodai et al. | 361/736 |
| 5,208,450 A | * | 5/1993 | Uenishi et al. | 235/492 |
| 5,244,840 A | | 9/1993 | Kodai et al. | 437/214 |
| 5,362,955 A | * | 11/1994 | Haghiri-Tehrani | 235/492 |
| 5,463,952 A | | 11/1995 | Kawasumi et al. | 101/454 |
| 5,501,900 A | | 3/1996 | Harada et al. | 428/323 |
| 5,534,905 A | | 7/1996 | Takahashi et al. | 347/171 |
| 5,578,796 A | | 11/1996 | Bhatt et al. | 174/260 |
| 5,581,065 A | | 12/1996 | Nishikawa et al. | 235/492 |
| 5,608,441 A | | 3/1997 | Takahashi et al. | 347/171 |
| 5,615,030 A | | 3/1997 | Harada et al. | 349/110 |
| 5,703,755 A | | 12/1997 | Flesher et al. | 361/737 |
| 5,744,792 A | * | 4/1998 | Imataki et al. | 235/492 |
| 5,786,988 A | | 7/1998 | Harari | 361/749 |
| 5,877,941 A | | 3/1999 | Ryu | 361/737 |
| 6,065,681 A | * | 5/2000 | Trueggelmann | 235/487 |
| 6,115,255 A | | 9/2000 | Iovdalsky | 361/705 |
| 6,320,751 B2 | * | 11/2001 | Takeda et al. | 361/737 |
| 6,398,114 B1 | * | 6/2002 | Nishikawa et al. | 235/492 |
| 2002/0050527 A1 | * | 5/2002 | Nishikawa et al. | 235/492 |

FOREIGN PATENT DOCUMENTS

| DE | 199 06 570 A1 | * | 8/2000 |
| EP | 0 535 436 A1 | | 4/1993 |
| EP | 0 638 873 A2 | | 2/1995 |
| JP | 6-24188 A | * | 2/1994 |

* cited by examiner

Primary Examiner—Michael G. Lee
Assistant Examiner—Jared J. Fureman
(74) Attorney, Agent, or Firm—Parkhurst & Wendel, L.L.P.

(57) ABSTRACT

A frame sheet comprises a core sheet, and oversheets. A recess is formed in the sheet frame. The oversheet is left in the recess in the sheet frame, and an IC carrier is mounted in the recess. The IC carrier is held, adhered to the oversheet left in the recess.

5 Claims, 9 Drawing Sheets

SHEET-FRAMED IC CARRIER AND METHOD FOR PRODUCING THE SAME

This is a Rule 1.53(b) Division of Ser. No. 09/099,395 filed Jun. 18, 1998, now allowed.

TECHNICAL FIELD OF THE INVENTION

The present invention relates to a small-sized IC carrier with an IC module mounted on, and a method for producing a sheet-framed IC carrier including a sheet frame.

BACKGROUND ART

Figure 11A:
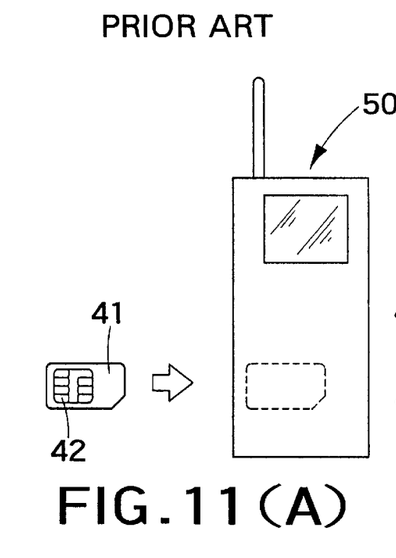
FIG. 11(A) is a view of the conventional IC carrier and a view explaining a use thereof.

FIG. 11(A) is a view which explains a conventional IC carrier and a method for using the same.

As shown in FIG. 11(A), an IC carrier 41 has an IC module 42 mounted on, which includes a CPU, memories, electrodes, etc. integrated. The IC carrier 41 is used as, for example, SIMs (Subscriber Identity Module) of portable telephones, etc.

A user acquires an SIM, which corresponds to a telephone subscription, and can buy a portable telephone 50 of common specifications in accordance with his use, and he uses the portable telephone 50 with the SIM (the IC carrier 41) mounted thereon.

However, the IC carrier 41 is not sufficiently prevalent and is limited in uses, and construction of special plants for mass-production of the IC carrier 41 will lead to cost increase. In a case that the IC carrier 41 is used as an SIM, the IC carrier 41 is mailed in an envelope, and its enveloping operation is bothering. A subscriber who has received the SIM might erroneously handle and break the SIM loose before mounting the SIM on the portable telephone 50.

Figure 11B:
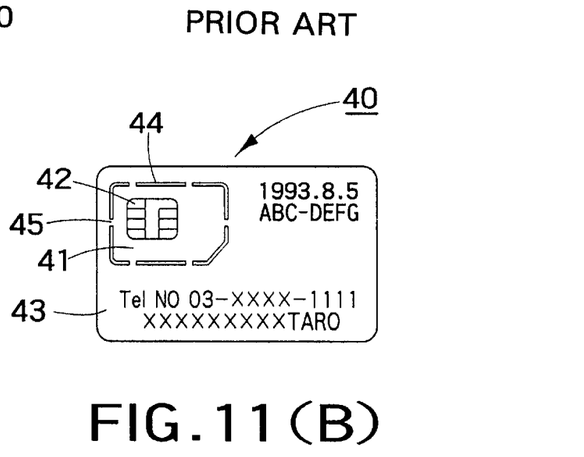
FIG. 11(B) is a view of the conventional IC carrier and a view of a use thereof.

In consideration of the above, it is proposed that the IC card 40 is formed by conventional equipment, and as shown in FIG. 11(B), a slit 44 for facilitating the removal of the IC card 40 is formed in a sheet frame 43 with bridges 45 left at a plurality of positions to enable the IC carrier 41 alone to be removed for use. This proposal allows not only the conventional equipment for producing and inspecting the IC card but also the conventional issue and mail systems of the IC card to be used as they are.

However, in the IC carrier of such conventional structure, when the IC carrier is removed from the IC base, disadvantageously loads, such as flex, torsion, etc. are applied to the IC module 42, with possible risks of breakage, leap-out, etc. Disadvantageously the bridges remain as residual projections when the IC carrier is removed from the sheet frame 43, which makes it difficult for the IC carrier is placed in a mount of the portable telephone 50 and which reversely may damage the IC carrier.

Figure 12A:
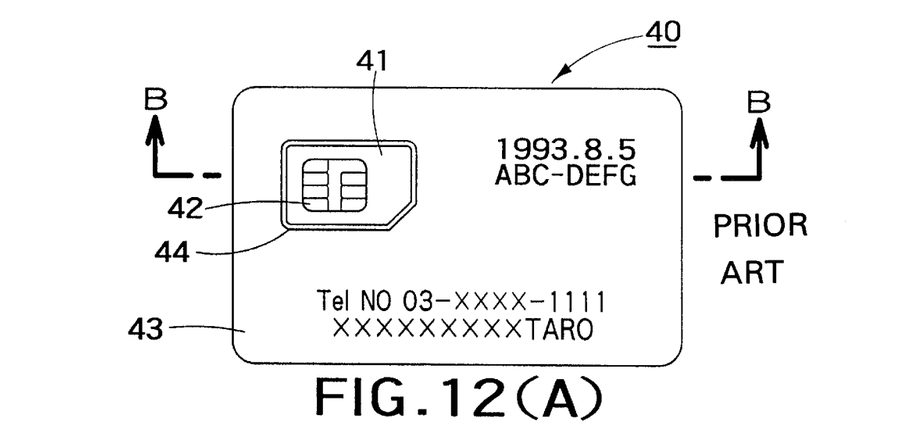
FIG. 12(A) is a plan view of another example of the conventional IC carrier.

FIG 12(A) is a view which explains another example of the conventional IC carrier.

Figure 12B:
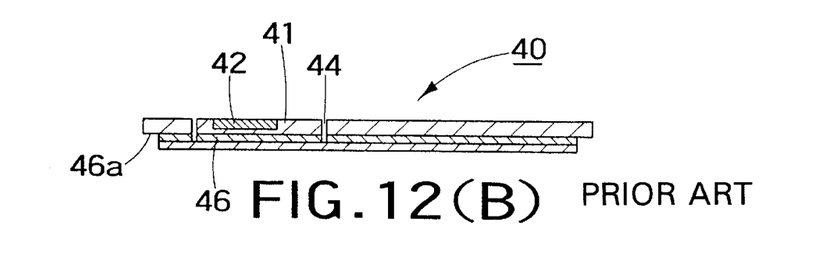
FIG. 12(B) is a B—B sectional view of FIG. 12(A).

An application (Japanese Patent Laid-Open Publication No. 276870/1995) filed by the applicant of the present application before the filing of the present application proposed an IC card 40 comprising, as shown in FIG. 12(B), an adhesive layer 46a provided on one surface of a sheet frame 43 having a recess, and a backing film 46 adhered to the backside of the sheet frame 43 through the adhesive layer 46a. An IC carrier 41 is held fixed in the recess by the adhesive layer 46a applied to the backing film 46.

This example also needs the step specialized in providing the backing film 46 to the backside of the sheet frame 43, which disadvantageously adds to the costs. Disadvantageously it is difficult to adhere the baking film 46 flat with no air layer between the sheet frame 43 and the same.

SUMMARY OF THE INVENTION

In view of the above-described disadvantages the present invention was made, and an object of the present invention is to provide a sheet-framed IC carrier which permits an IC carrier to be properly held in a sheet frame without the use of the bridges and backing film, and a method for producing the sheet-framed IC carrier.

The present invention relates to a sheet-framed IC carrier comprising a sheet frame including a core sheet and an oversheet provided on at least one surface of the core sheet, and including a recess formed therein with the oversheet left; and an IC carrier mounted in the recess of the sheet frame, held by the oversheet left in the recess and including an IC module. The present invention also relates to a method for producing a sheet-framed IC carrier including a sheet frame which has a core sheet and an oversheet provided on at least one surface of the core sheet and has a recess formed therein with the oversheet left; and an IC carrier which is mounted in the recess of the sheet frame and held by the oversheet left in the recess, and has an IC module, the method comprising the step of laying the oversheet on at least one surface of the core sheet and press-fusing the core sheet and the oversheet to each other; the step of spot-facing the core sheet to form a recess; the step of forming in the core sheet a peripheral slit to be a peripheral edge of the IC carrier; and the step of mounting the IC module in the recess.

In the sheet-framed IC carrier according to the present invention as the IC carrier is held, releasably adhered to the oversheet on the sheet frame, with the recess formed, the IC carrier can be easily released from the sheet frame when required.

Furthermore, contrary to the conventional IC carrier which is held by the sheet frame through bridges, the IC carrier of the present invention is free from residues and breakages of the edge caused by breakage of the bridges. It is not necessary to use a special material and use a separate step, contrary to the conventional case when the IC carrier is held by an adhesive film.

In the method for producing the sheet-framed IC carrier according to the present invention, such sheet-framed IC carrier can be produced easily and at low costs by using the conventional equipments.

PREFERRED EMBODIMENTS

A First Embodiment of the Sheet-Framed IC Carrier

Figure 1A:
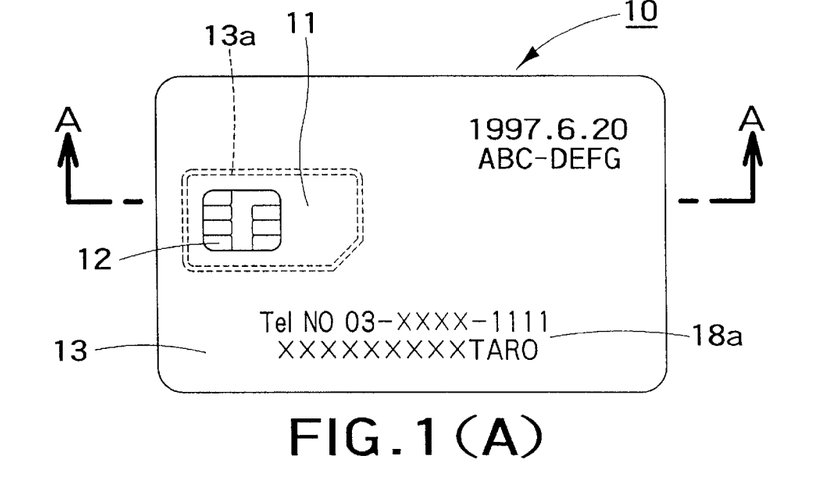
FIG. 1(A) is a plan view of the sheet-framed IC carrier according to a first embodiment of the present invention.
Figure 1B:
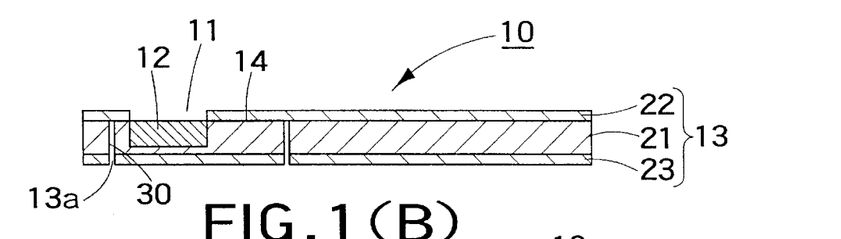
FIG. 1(B) is an A—A sectional view of FIG. 1A.
Figure 1C:
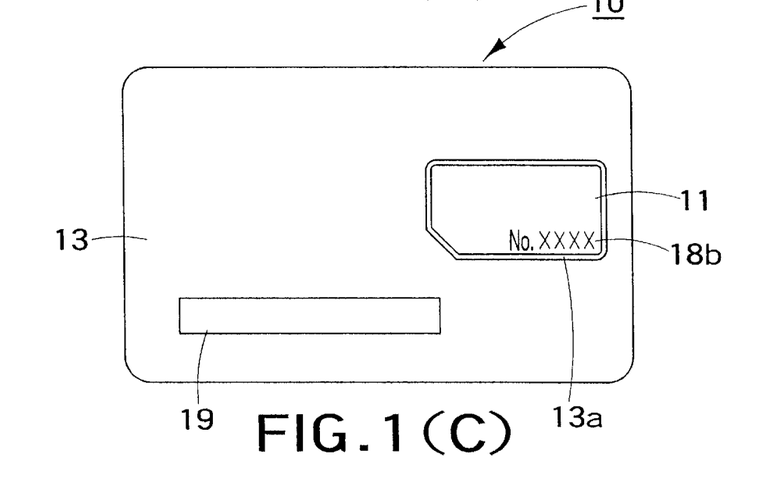
FIG. 1(C) is a backside view of the sheet-framed IC carrier according to the first embodiment of the present invention.

FIGS. 1(A) to 1(C), FIGS. 5(A) to 5(B), and FIG. 6 are views of the sheet-framed IC carrier according to a first embodiment of the present invention. FIG. 1(A) is a plan view of the sheet-framed IC carrier according to the first embodiment. FIG. 1(B) is a sectional view of the sheet-framed IC carrier according to the first embodiment along A—A in FIG. 1(A). FIG. 1(C) is a backside view of the sheet-framed IC carrier according to the first embodiment of the present invention.

Figure 9A:
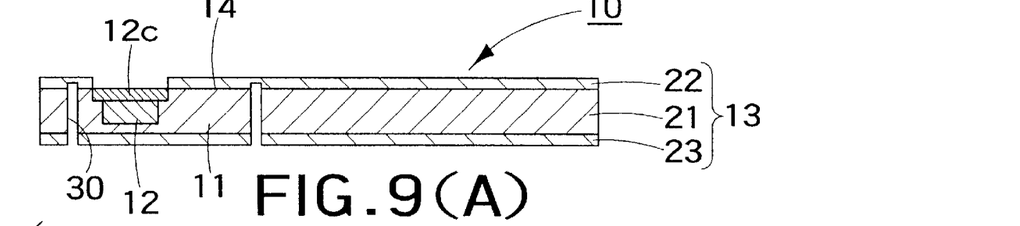
FIG. 9(A) is a view of a state of the IC carrier held on the upper oversheet being peeled off.
Figure 9B:
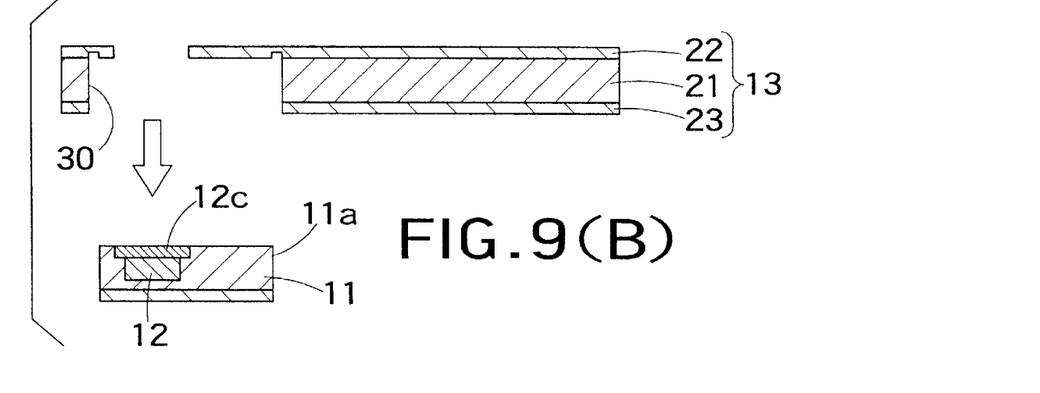
FIG. 9(B) is a view of a state of the IC carrier held on the upper oversheet being peeled off.

As shown in FIGS. 1(A) to 1(C), the sheet-framed IC carrier 10 comprises a sheet frame 13 with a recess 30(FIG. 9(B) formed and which has a core sheet 21 and oversheets 22, 23 provided on both surfaces of the core sheet 21, and an IC carrier 11 mounted in the recess 30 of the sheet frame 13 and having an IC module 12 mounted thereon. One of the oversheets, e.g., the oversheet 22 is left in the recess 30 of the sheet frame 13, and the IC carrier in the recess is secured, and adhered to the oversheet 22.

The core sheet 21 of the sheet frame 13 and the oversheet 22 are formed of a resin sheet, as of vinyl chloride resin or others, as the IC carrier 11 is held by chloride resin or others, and the IC carrier 11 is held by the oversheet 22 on the side of the module 12. A peripheral edge slit 13a is formed in the core sheet 21 and the oversheet 23 along the outer periphery of the IC module 12. The peripheral edge slit 13a is shown by the dotted line in FIG. 1(A) and by the solid line in FIG. 1(C). A display 18a is provided on the sheet frame 13, and a display 18b is provided on the IC carrier 11. A sign panel 19 is provided on the sheet frame 13. A fusion preventing layer 14 for preventing fusion with the oversheet 22 is provided on the surface of the IC carrier 11 on the side of the IC module 12.

Then, the IC carrier 11 will be detailed with reference to FIGS. 5(A) and 5(B), and FIG. 6.

Figure 5A:
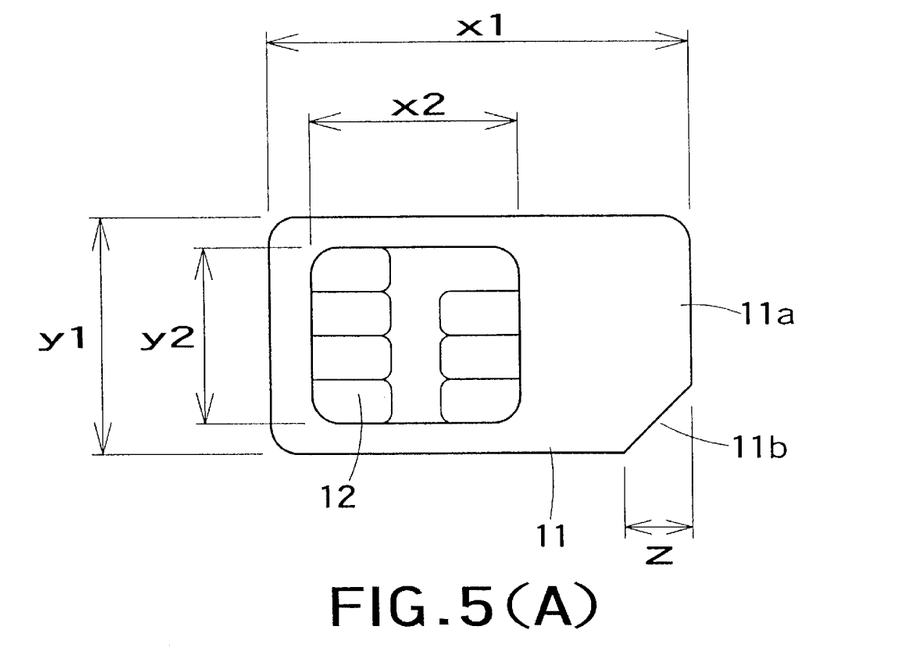
FIG. 5(A) is a plan view of the IC carrier.
Figure 5B:
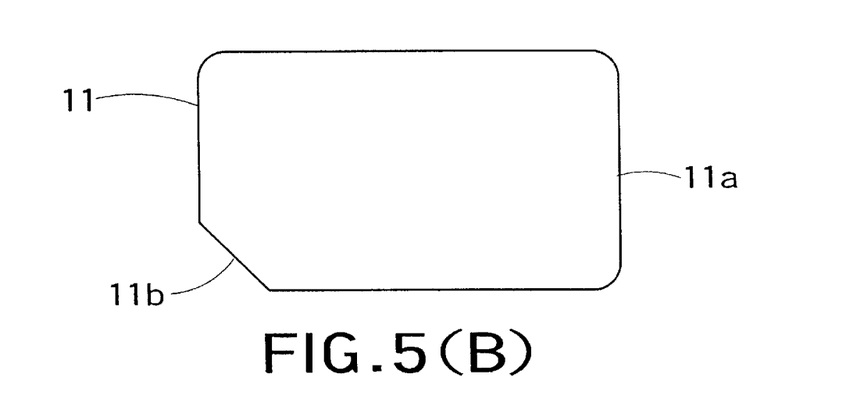
FIG. 5(B) is a backside view of the IC carrier.

FIG. 5(A) shows the surface of the IC carrier, and FIG. 5(B) shows the backside of the IC carrier. As shown in FIG. 5(A), the IC carrier 11 comprises a base 11a of a resin of a length Y1 (about 15.00 mm)×a width X1 (about 25.00) and the IC module 12 of a length Y2 (about 10.6 mm)×a width X2 (about 12.0 mm) mounted on the base 11a. A cut-off 11b is formed on the base 11a for positioning the IC carrier 11 when the IC carrier 11 is mounted on a machine or tool for the IC carrier 11 to be mounted on. The cut-off 11b has a length Z of about 3.00 mm.

Figure 6:
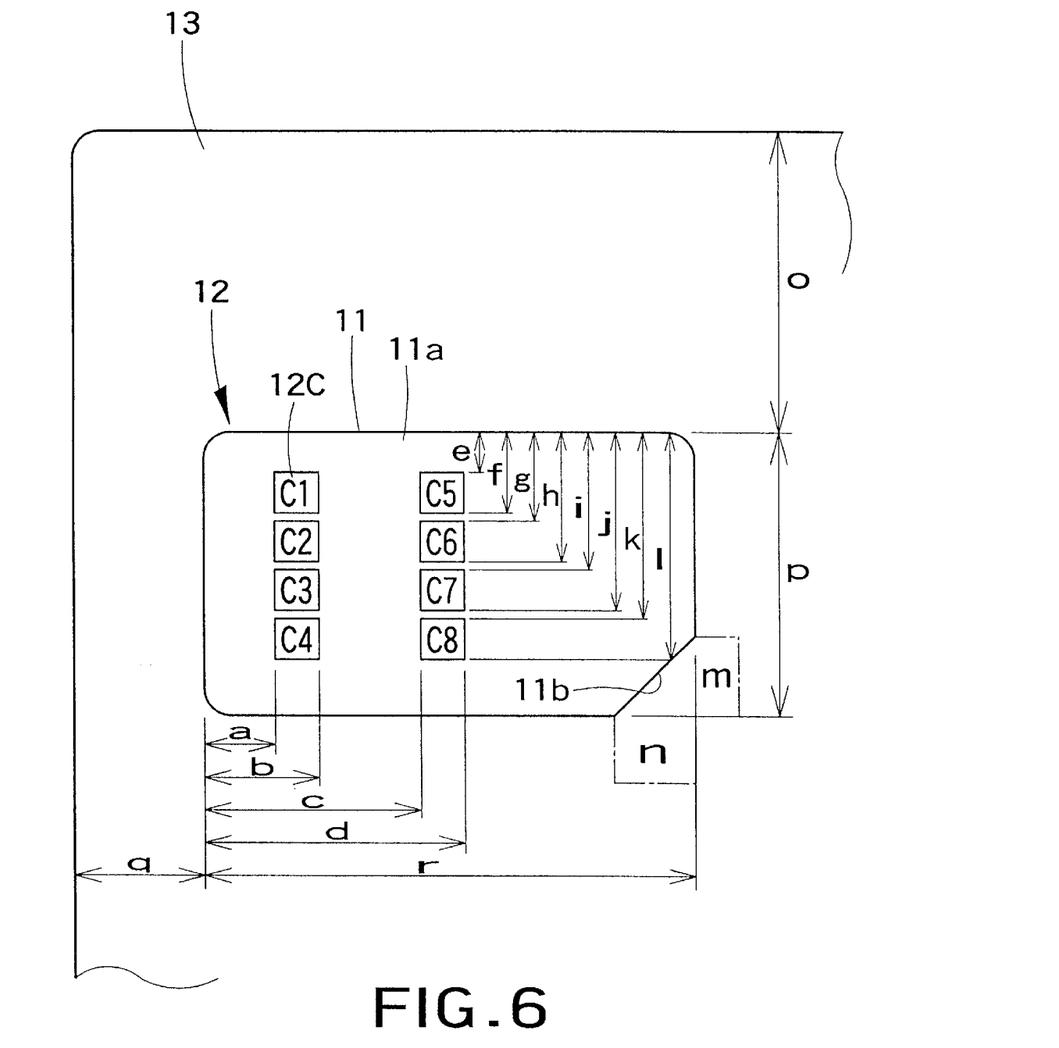
FIG. 6 is a plan view detailing the IC carrier.

FIG. 6 is a plan view detailing another example of the IC carrier according to the present invention. The IC carrier 11 comprises a base 11a, and an IC module 12 mounted on the base 11a. The IC module 12 has an external terminal 12c including 8 contacts (C1–C8), and the respective external terminals 12c are substantially quadrangular. It is preferable that the external terminal 12c is positioned in accordance with ISO (a position of an IC module of an IC card in accordance with ISO). That is, as viewed in FIG. 6, a distance a, a distance b, a distance c and a distance d from the left edge of the IC carrier 11 are respectively 4.0 mm at maximum, 6.0 mm at minimum, 11.62 mm at maximum and 13.62 mm at minimum, and a distance e, a distance f, a distance g, a distance h, a distance i, a distance j, a distance k and a distance l from the upper edge of the IC carrier 11 are respectively 2.75 mm at maximum, 4.45 mm at minimum, 5.29 mm at maximum, 6.99 mm at minimum, 7.83 mm at maximum, 9.53 at minimum, 10.37 mm at maximum and a 12.07 at minimum. As viewed in FIG. 6, distances o and q of the IC carrier 11 from edges of the sheet frame 13 are respectively 16.48 mm and 6.25 mm. The IC carrier 11 has a shape having a dimension p of 15±0.1 mm and a dimension r of 25±0.1 mm. The cut-off has a size having dimensions m and n of 3±0.1 mm.

Then, materials of the respective members will be described. The core sheet 21 of the sheet frame 13 and the IC carrier 11 are formed of vinyl chloride but may be formed of a hard resin, as of acryl, polymethylmethacrylate, polycarbonate, acrylonitrile-butadiene-styrene copolymer (ABS), polybutyleneterephthalate (PBT), polymer alloys of these resins, or others. Of these resins acryl resin and polycarbonate resin, which are capable of being easily cut, allow spot-facing to be done with high precision. Generally hard vinyl chloride with no or a small amount (1–5%) of a plasticizer added is used.

A material and a thickness of the oversheets 22, 23 preferably have an above 80% total light transmission. The oversheets 22, 23 having a high light transmission are transparent and make color tones of printed pictures and patterns visible without impairing appearance. The oversheets 22, 23 can be formed of a resin of polyvinyl chloride, polycarbonate, polymethylmethacrylate, polybutyleneterephthalate (PBT), cellulose acetate, nylon, ethylene-vinyl acetate copolymer saponificate, polypropylene, polyvinyl butyral, acrylonitrile-butadiene-styrene copolymer, methyl methacrylate-butadiene-styrene copolymer or a polymer alloy of them as long as they have good thermal fusion with the core sheet 21.

A printing ink vehicle forming the fusion preventing layer 14 is preferably one that is not dissolved with the core sheet 21 and the oversheets 22, 23 when heated. That is, vinyl chloride and other vinyl-based materials are not used, but cellulose-based ones, as of nitrocellulose, ethyl cellulose, etc., can be used for this end. The printing ink vehicle containing a solvent dissolves the material of the core sheet 21 and tends to cause the fusion. Accordingly it is also preferable that the printing ink is composed of a photo-setting or thermo-setting monomer and contains no solvent. As the photo-setting ink a (metha)acrylate-modified resin monomer, such a urethane-based (metha)acrylate, polyester-based (metha)acrylate or others can be used together with a reactive diluent and a photo-setting initiator.

A Second Embodiment of the Sheet-Framed IC Carrier

Figure 2A:
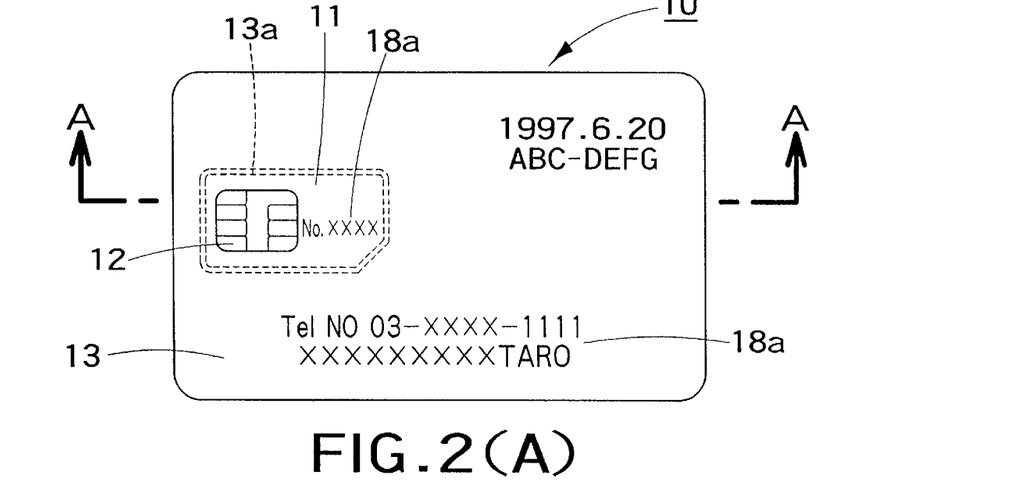
FIG. 2(A) is a plan view of the sheet-framed IC carrier according to a second embodiment of the present invention.

FIG. 2(A) is a plan view of the sheet-framed IC carrier according to a second embodiment of the present invention.

Figure 2B:
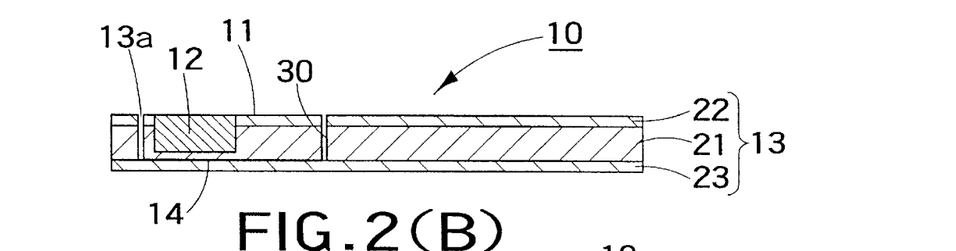
FIG. 2(B) is an A—A sectional view of FIG. 2A.
Figure 2C:
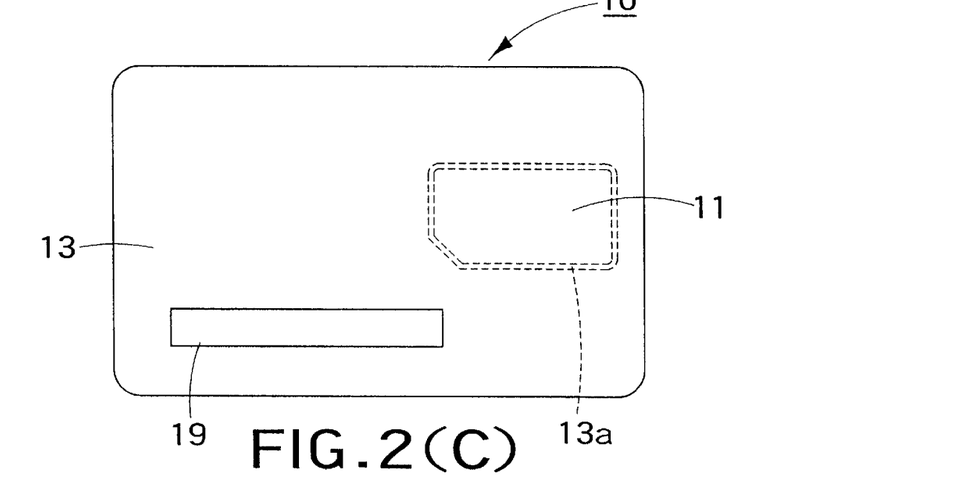
FIG. 2(C) is a backside view of the sheet-framed IC carrier according to the second embodiment of the present invention.

FIG. 2(B) is a sectional view of the sheet-framed IC carrier along the line A—A in FIG. 2(A). FIG. 2(C) is a backside view of the sheet-framed IC carrier according to the second embodiment.

The second embodiment shown in FIGS. 2(A) to 2(C) is different from the first embodiment only in that an IC carrier is mounted in a recess 30 in a sheet frame 13, and the IC carrier is held, adhered to an oversheet 23 below a core sheet 21, but is substantially the same as the first embodiment shown in FIGS. 1(A) to 1(C), FIGS. 5(a) to 5(B) and FIG. 6. The same members of the second embodiment as those of the first embodiment are represented by the same reference numbers not to repeat their detailed explanation.

A sheet-framed IC carrier according to the present embodiment includes an IC carrier 11 and sheet frame 13. The sheet frame 13 is formed of a sheet resin of vinyl chloride or others. The IC carrier 11 is held by an oversheet 23 on the opposite side of an IC module. A peripheral edge slit 13a is formed along a peripheral edge of the IC carrier 11. The peripheral edge slit 13a is indicated by the solid line in FIG. 2(A) and indicated by the dotted line on the backside shown in FIG. 2(C).

A fusion preventing layer 14 for preventing the fusion with the oversheet 23 is provided on the surface of the IC carrier 11 opposite to the IC module 12.

A Third Embodiment of the Sheet-Framed IC Carrier

Next, the sheet-framed IC carrier according to a third embodiment of the present invention will be explained with reference to FIG. 3.

Figure 3:
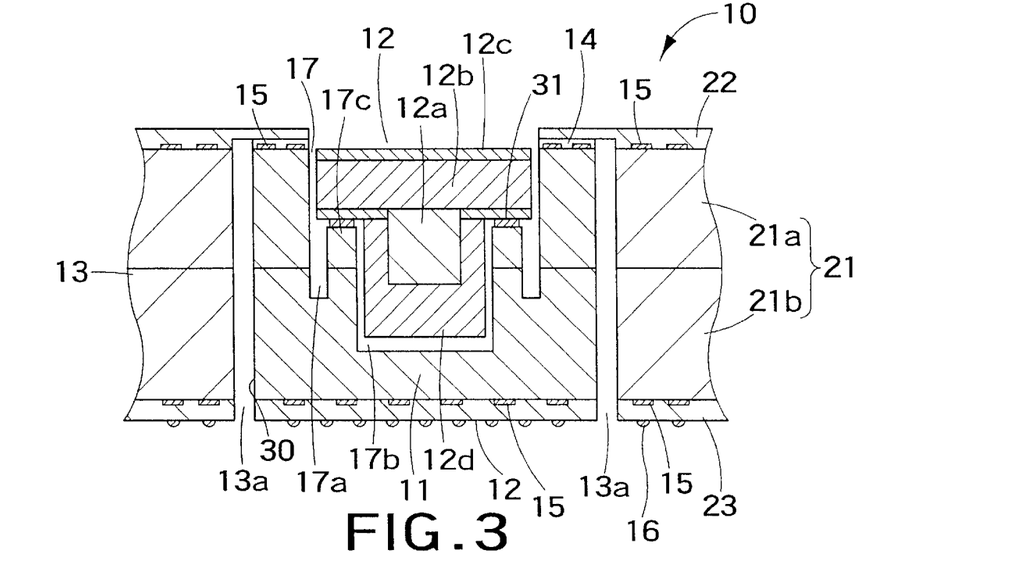
FIG. 3 is a sectional view of the sheet-framed IC carrier according to a third embodiment of the present invention.

The third embodiment shown in FIG. 3 is different from the first only in the structure of the IC carrier 11 but is substantially the same in the other points as the first embodiment shown in FIGS. 1(A) to 1(C), FIGS. 5(A) to F(B) and FIG. 6. The same members of the third embodiment as those of the first embodiment are represented by the same reference numbers.

In FIG. 3, a sheet frame 13 comprises a core sheet 21 including an upper core sheet 21a and a lower core sheet 21b; oversheets 22, 23; and an IC module recess 17 formed by machining the core sheet 21 by means of a spot-facing tool. An IC module 12 of the IC carrier 11 is mounted in the IC module recess 17 machined by the spot-facing tool and is secured to the IC module recess 17 by an adhesive 31. Hollows 17a, 17b are formed in the IC module recess 17 and function to receive an excess of the adhesive and mitigate flexural stress. The IC module 12 is adhered especially to a projection 17c in the IC module recess 17. The IC module can be fabricated, for example, by mounting an IC chip 12a on a print substrate 12b and molding the IC chip 12a with a sealing resin 12d. The surface of the IC module 12 is an external terminal 12c.

In the present embodiment, a peripheral edge slit 13a defining a peripheral edge of the IC carrier 11 is formed by spot-facing the opposite side of the IC module 12 by a spot-facing tool, and the IC carrier 11 is held by the oversheet 22. A fusion preventing layer 14 is formed between the oversheet 22 and the IC carrier 11 and prevents complete fusion of the IC carrier 11 with the oversheet 22 to allow the IC carrier 11 to be easily peeled off at this part.

In this case, the fusion preventing layer 14 is provided on the surface of the upper core sheet 21a forming the IC carrier 11. Printed layers 15, 16 are respectively provided on the surface of the core sheet 21 and the backside of the oversheet 23.

A Fourth Embodiment of Sheet-Framed IC Carrier

Next, with reference to FIG. 4, the sheet-framed IC carrier according to a fourth embodiment of the present invention will be explained. The fourth embodiment shown in FIG. 4 is different from the third embodiment shown in FIG. 3 only in that an IC carrier 11 is mounted in a recess 30 in a sheet frame 13, and the IC carrier 11 is held by a lower oversheet 23 of a core sheet 21 but is substantially the same in the other points as the third embodiment shown in FIG. 3.

The same members of the fourth embodiment as those of the third embodiment are represented by the same reference numbers.

Figure 4:
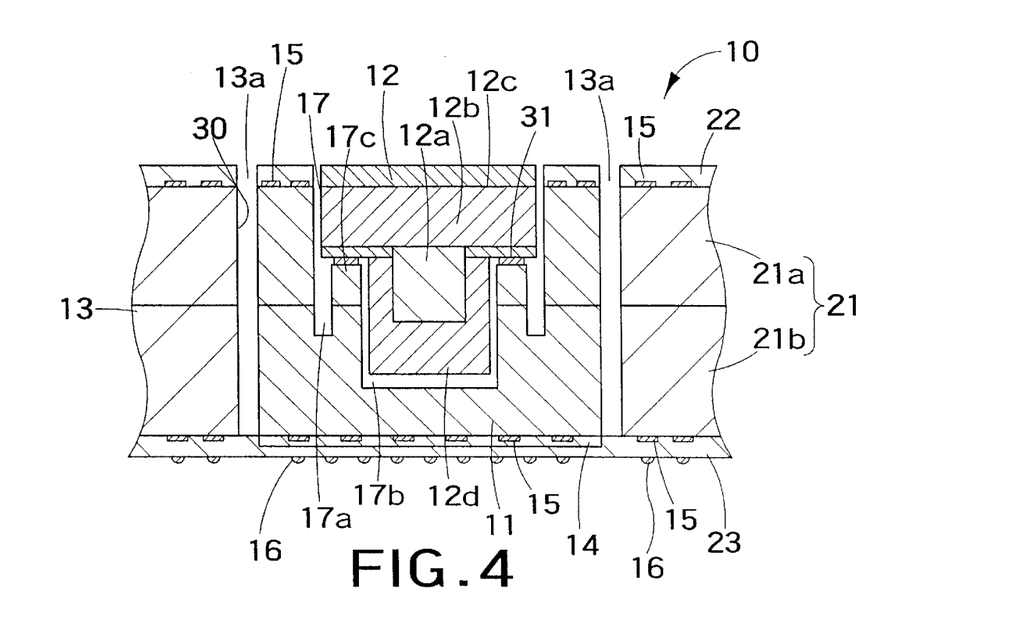
FIG. 4 is a sectional view of the sheet-framed IC carrier according to a fourth embodiment of the present invention.

In FIG. 4 a peripheral edge slit 13a defining a peripheral edge of the IC carrier 11 is formed from the side of the IC module 12 by a spot-facing tool, and the IC carrier 11 is held by the oversheet 23. A fusion preventing layer 14 is formed between the oversheet 23 and the IC carrier 11, and prevents complete fusion of the IC carrier 11 with the oversheet 23 and allows the IC carrier 11 to be easily peeled off at this part.

In this case, the fusion preventing layer 14 is provided on the surface of a lower core sheet 21b forming the IC carrier 14.

In the third and the fourth embodiments the IC carrier 11 can be easily removed from the sheet frame 13, but in the fourth embodiment the IC carrier 11 is contact the oversheet 23 at a larger area than in the third embodiment to strongly secure the IC carrier 11. The oversheet 22 remains on the side of the IC module 12 after the IC carrier 1 has been removed, which allows the IC carrier 11 to have better appearance.

Figure 7:
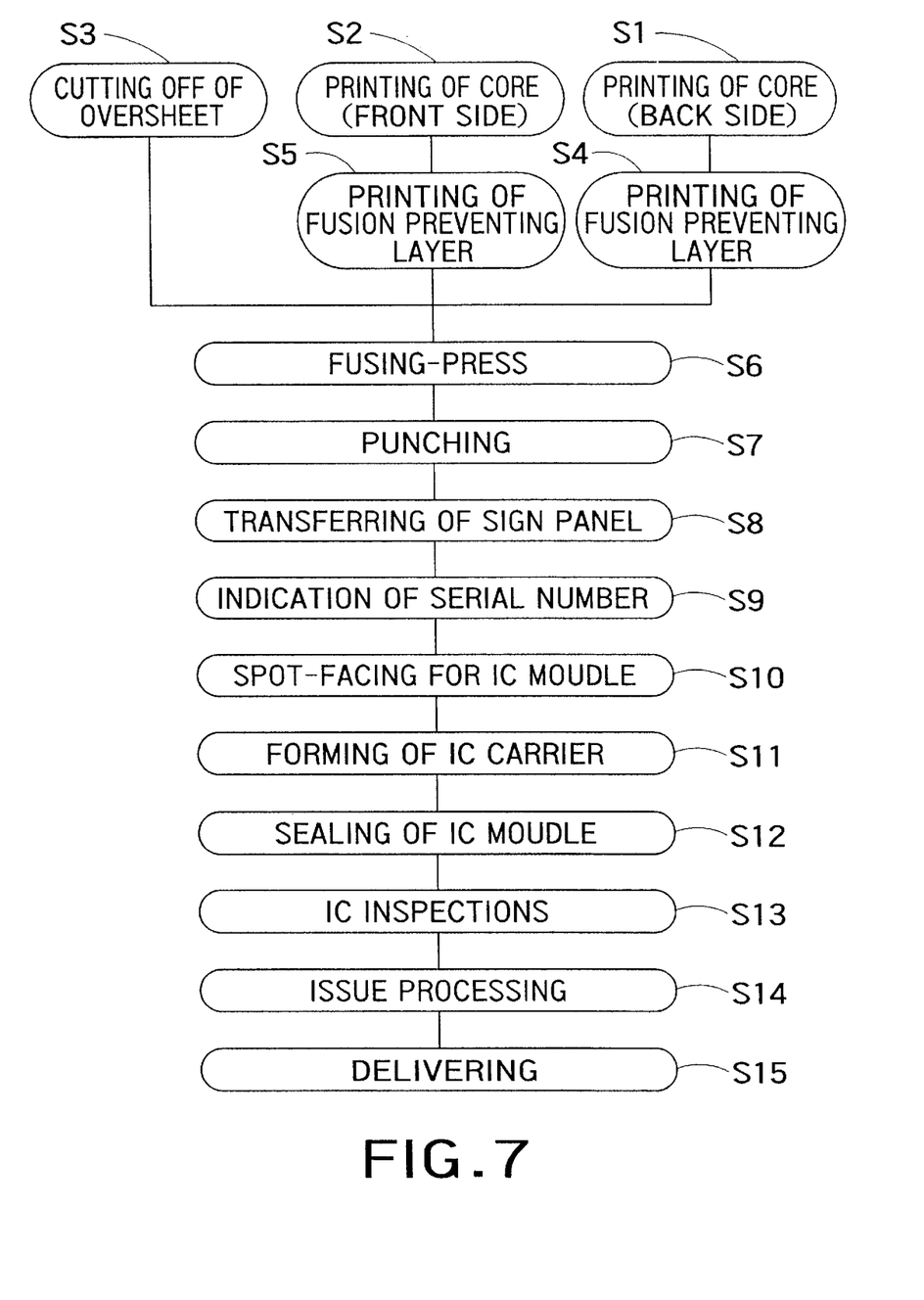
FIG. 7 is a view of the steps of producing the sheet-framed IC carrier according to the present invention.

Embodiments of Production of the Sheet-Frame IC Carrier and Use of the Sheet-Framed IC Carrier FIG. 7 is a flow chart of the production process of the sheet-framed IC carrier according to the present invention.

First in accordance with the method of producing a usual plastic card, the core sheet 21 having the upper core sheet 21a and the lower core sheet 21b to be the front side and the back side of the core sheet 21, and the upper and the lower oversheets 22, 23 are laid one on another and press-adhered. The core sheet 21 may be formed of one sheet as required, and therefore either of the upper and the lower oversheets 22, 23 may be omitted.

Before the above press-adhered process, the usual ornamental print layer 15 is suitably provided on a surface 21 of the core sheet 21 to be faced outside by silk screen printing or offset printing (S1, S2). The oversheets 22, 23 are cut off into a required size (S3).

Then, the fusion preventing layer 14 is provided on the core sheet 21 by printing or other means (S4, S5). As described above, the fusion preventing layer 14 is for forming the peeling portion where the IC carrier 11 is easily peeled off (released off) the oversheets 22, 23. The fusion preventing layer 14 is formed on the surface of the upper core sheet 21a on the side of the IC module 12, which contacts the oversheet 22 in the third embodiment shown in FIG. 3, and in the fourth embodiment shown in FIG. 4 on the surface of the lower core sheet 21b, which contacts the oversheet 23. Accordingly, either of the steps S4 and S5 is selected in accordance with specifications.

The fusion preventing layer 14 can be formed by a method other than offset printing, but offset printing is more advantageous in that the function of the fusion preventing layer 14 can be optionally adjusted depending on area percentages of halftone dots, and the fusion preventing layer 14 can be formed thin. The same effect can be achieved by halftone dot typographic printing or invented halftone gravure although their practical possibility is low. Silk screen printing and the usual coating will find it difficult to control halftone dot area percentages.

To facilitate the peel-off, an area percentage of halftone dots forming the fusion preventing layer 14 is suitably 60–80%. For some fusability, a 40–60% halftone dot area percentage is suitable. When a halftone dot area is below 40%, strong fusion takes place between the oversheets 22, 23 and the core sheet 21, unpreferably with a risk that the IC carrier might be broken. But a degree of the fusion prevention depends on characteristics of an ink and the following press conditions, and further material qualities of the oversheets 22, 23 and the core sheet 21, and the above-described halftone dot area percentage cannot be uniformly defined.

The fusion preventing layer 14 can have a higher halftone dot area percentage at the peripheral edge of the IC carrier 11 and a lower halftone dot area percentage at the central part of the IC carrier 11. When the IC carrier 11 is peeled off, usually the peripheral part of the IC carrier 11 will be pressed with finger tips to peel off a part of the edge of the IC carrier 11, and the partially peeled edge is pinched with fingers to release the IC carrier 11. Accordingly, it is not necessary that the IC carrier 11 is made especially easily releasable at the part other than the peripheral part thereof, and the halftone dot area is smaller at the central part of the IC carrier 11. In a case that the IC carrier 11 generally has very weak adhesion with respect to the oversheets 22, 23, a problem is that the IC carrier 11 may unexpectedly fall and be lost.

Figure 8A:
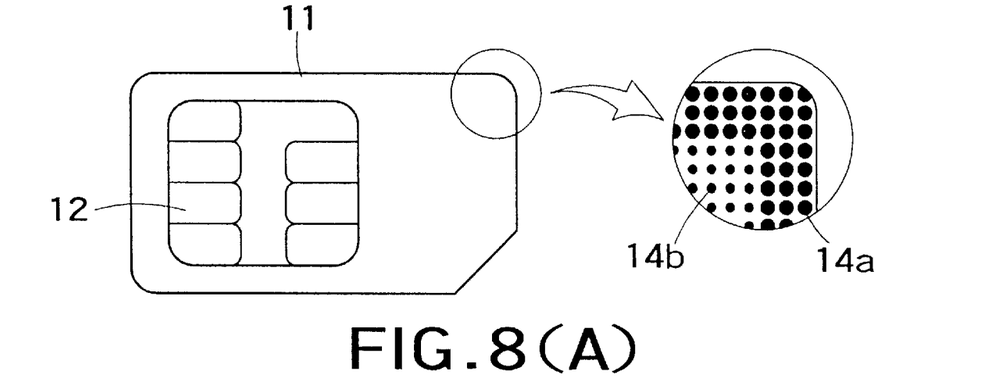
FIG. 8(A) is a view explaining the fusion preventing layer provided on the IC carrier.
Figure 8B:
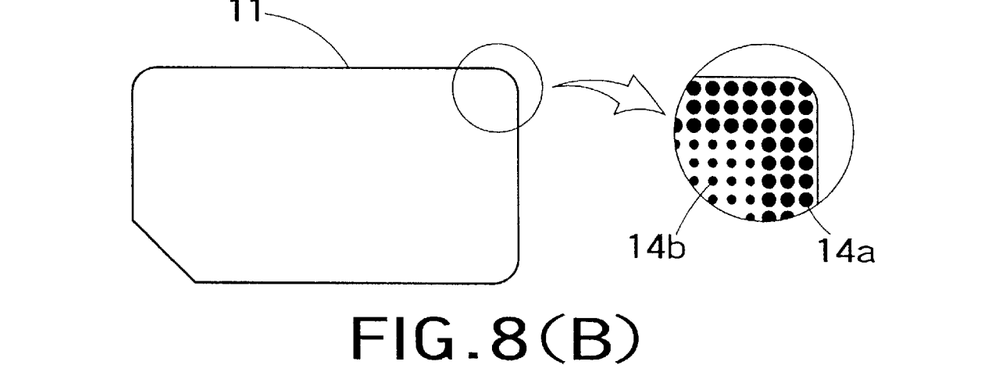
FIG. 8(B) is a view explaining the fusion preventing layer provided on the IC carrier.

Next, arrangement of the halftone dots on the fusion preventing layer 14 will be explained with reference to FIGS. 8(A) to 8(C). FIG. 8(A) shows a case where the fusion preventing layer 14 is printed on the surface of the IC carrier 11 on the side of the IC module 12. FIG. 8(B) shows a case where the fusion preventing layer 14 is printed on the backside. In both cases the fusion preventing layer 14 can be formed in the same way. FIGS. 8(A) and 8(B) respectively show in the enlarged circles larger-area halftone dots 14a provided on the peripheral part of the IC carrier 11, and smaller-area halftone dots 14b provided at the central part of the IC carrier 11.

In this case, in FIG. 8(A) the IC carrier is held by the oversheet 22 (see FIG. 1(B)), and in FIG. 8(B) the IC carrier is held by the oversheet 23 (see FIG. 2(B)).

Figure 8C:
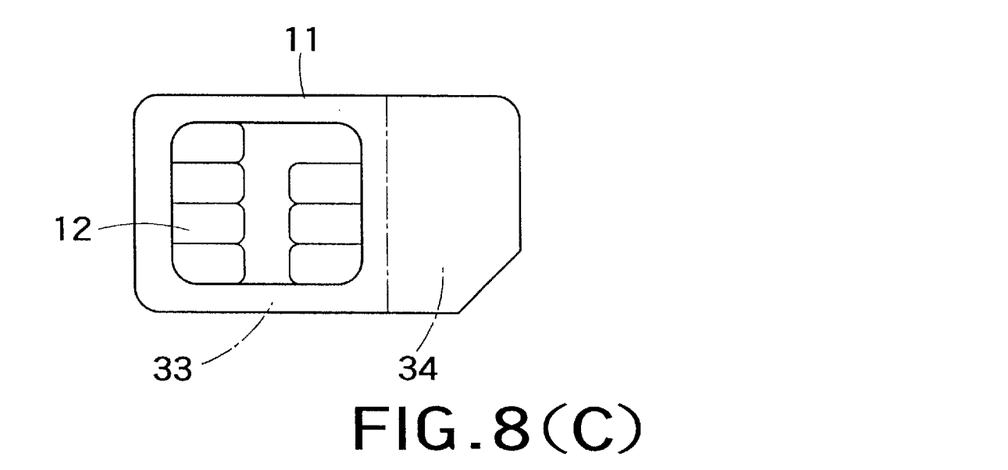
FIG. 8(C) is a view explaining the fusion preventing layer provided on the IC carrier.

It is possible that as shown in FIG. 8(C), the surface of the IC carrier 11 on the side of the IC module 12 is divided in two regions, and the fusion preventing layer 14 is not provided in one region 33 with the IC module 12 and is provided only in the other region 34. The IC carrier 11 shown in FIG. 8(C) substantially corresponds to that shown in FIG. 8(A). In the IC carrier 11 shown in FIG. 8(C), the fusion preventing layer 14 is provided in the other region 34, whereby the IC carrier 11 can be easily peeled off the sheet frame 13 in the other region 34.

Then, in accordance with the flow chart shown in FIG. 7, the upper core sheet 21a, the lower core sheet 21b, and the oversheets 22, 23 are laid one on another and sandwiched by specular plates and the respective sheets 21a, 21b, 22, 23 are pressed by a press machine to fuse them (S6). The press operation is performed at 150° C. for 15 minutes in a case that the respective sheets 21a, 21b, 22, 23 are formed of vinyl chloride resin.

Then, the fused sheets 21a, 21b, 22, 23 are punched in a card size (S7). Transfer foil for the sign panel 19 is transferred to the thus-prepared card (S8). The sign panel 19 is for the signature of a use of the card, and a well-known type of the sign panel is a transfer foil of a layer of a material which is easy to write. Then, indications 18a, 18b, such as a manufacturer's serial number, information of an issuer, necessary bar codes, etc., are thermo-transferred by the use of thermo-transfer ribbons or others (S9). The indications 18a, 18b may be printed by laser marking.

Next, the IC (module) recess 17 for the IC module 12 to be mounted in is formed in the card by a spot-facing tool (S10). At that time, in the third embodiment shown in FIG. 3 the IC module recess 17 is cut deeper by a thickness of the upper oversheet 22 than the IC module recess 17 of the fourth embodiment shown in FIG. 4 so that the external output 12c of the IC module 12 is not projected beyond the plane of the IC carrier 11. Following the formation of the recess 17 by spot-facing the peripheral edge slit 13a defining the peripheral edge of the IC carrier 11 is formed along the outer periphery of the IC module 12. At this time, in the first and the third embodiments respectively shown in FIGS. 1 and 3 the spot-facing is performed on the opposite side of the IC module 12, and the spot-facing is performed on the side of the IC module 12 in the second and the fourth embodiments respectively shown in FIGS. 2 and 4.

The spot-facing is performed in a depth which allows the core sheet 21 to be completely cut off but does not allow the oversheets 22, 23 to be cut off (the oversheets 22, 23 may be cut by a part of their thickness) (S11). It is possible that the spot-facing may be performed by the so-called half blanking in which the core sheet 12 is completely cut off by punching, but the oversheets 22, 23 are not cut off.

Then, a thermo-setting adhesive is injected into the IC module recess 17 for the IC module 12, and the IC module 12 is mounted and is pressed by hot platens (S12). The IC module 12 is thus mounted on the card into which the sheets 21a, 21b, 22 and 23 for the IC carrier 11 have been press-fused and punched. The IC module 12 can be adhered by other adhesives, adhesive double coated seals or by the use of both. Next, IC inspections for IC characteristics, etc. are conducted on the IC module 12 (S13). Then, an issue processing step of writing data in accordance with a use of the IC carrier is performed (S14). The issue processing is specifically for inputting in memories the telephone number of a subscriber, the ID number of the subscriber, the pass word of the subscriber, etc. Then, the step of fitting the sheet-framed IC carrier into a base with a slit, and enveloping the same, closing the envelope and delivering the same (S15).

In the above-described steps the printing of numbers, etc. (S9) may be performed after the module sealing (S12), and the spot-facing of the IC module (S10) and the spot-facing of the IC carrier (S11) may be replaced in sequence by each other.

The above-described method for producing a sheet-framed IC carrier according to the present invention is the same except printing the fusion preventing layer 14 and spot-facing the peripheral edge slit 3a defining the peripheral edge of the IC carrier 11 as the conventional method for producing an IC card. Furthermore, because the step of printing the fusion preventing layer 14 and the step of spot-facing the peripheral slit 13a can be performed by the production equipment for the conventional IC card, the step of various inspections of the IC carrier 11, and the packaging and delivery step of the enveloping can be performed by the process of producing the IC card as it is, and sufficient machining precision can be ensured.

Generally cards, such as sheet frames, are restricted to have a 0.76 mm±0.08 mm thickness. For the sheet frame 13 having such thickness, the peripheral edge slit 13a has preferably a 0.1–3.0 mm width. When the peripheral edge slit 13a has a width of above 3.0 mm, unexpected peel-off may take place, and the appearance is not satisfactory. When the peripheral edge slit 13a has a width of below 0.1 mm, a spot-facing drill is so thin that the spot-facing step is made difficult. When the peripheral edge slit 13a has a width of below 0.5 mm, it is preferable for efficiency that the peripheral edge slit 13a is formed by punching by a press in place of the spot-facing.

Then, the method of using the sheet-framed IC carrier will be explained with reference to FIG. 9(A) to FIG. 10(B).

FIGS. 9(A) and 9(B) are views showing states the IC carrier 11 held by the oversheet 22 which is peeled off the sheet frame 13. In this case, the fusion preventing layer 14 is formed on the surface of the IC carrier on the side of the IC module 12, and the oversheet 22 is left on the side of the sheet frame 13 with none of the oversheet 22 left on the backside of the IC carrier 11. Accordingly, when the indication 18b, such as numbers, etc., are printed, it is necessary to print the indication on the surface of the IC carrier 11 on the side opposite to the IC module 12.

Figure 10A:
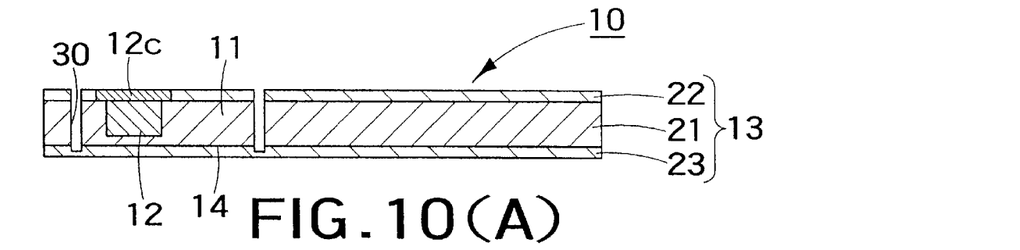
FIG. 10(A) is a view of a state of the IC carrier held on the lower oversheet being peeled off.
Figure 10B:
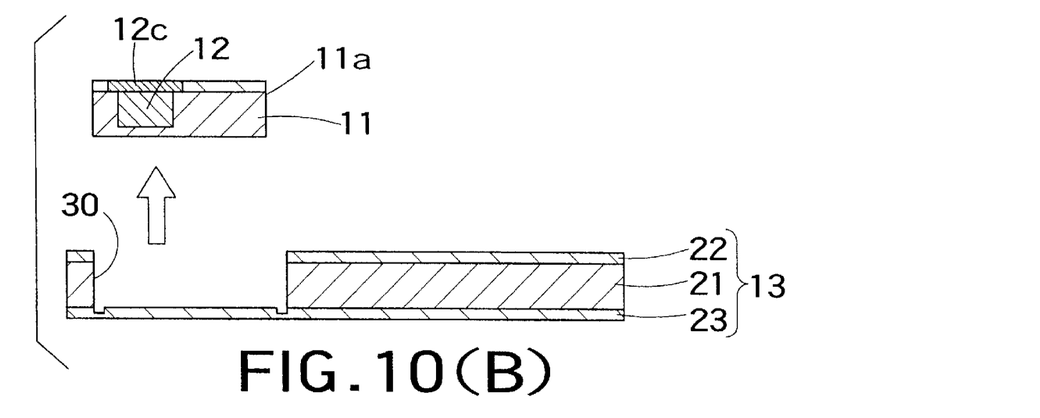
FIG. 10(B) is a view of a state of the IC carrier held on the lower oversheet being peeled off.

FIGS. 10(A) and 10(B) are views showing states of the IC carrier 11 held by the oversheet 23, which is peeled off the sheet frame 13. In this case, the fusion preventing layer 14 is formed on the surface of the IC carrier 11 on the side opposite to the IC module 12, and the oversheet 23 is left on the side of the sheet frame 13 with none of the oversheet 23 left on the backside of the IC carrier 11. Accordingly, the indication 18b, such as numbers, etc., can be printed on the surface of the IC carrier on the side of the IC module 12.

As apparent in FIG. 9(A) to FIG. 10(B), in the respective cases after the IC carrier 11 is removed from the sheet frame 13, the base 11 of the IC carrier 11 and the external terminal 12c of the IC module are in the same plane.

EXAMPLES

Next, examples of the present invention will be explained.

Example 1

The sheet-framed IC carrier 10 shown in FIG. 3 was produced by the production process shown in FIG. 7. The process will be explained with reference to FIG. 7.

A polymer alloy (heat resistance temperature: 120° C.) prepared by mixing acrylonitrile-butadiene-styrene (ABS) resin (50 weight parts) and polycarbonate resin (50 weight parts) was blended with titanium oxide (5 weight parts) and was extruded by T die technique into the core sheet 21 of 0.35 mm-thickness formed of a white upper core sheet 21 and a white lower core sheet 21b. The core sheet 21 was formed of a polymer alloy of such resins to be easily cut for the spot-facing and especially to have higher heat resistance which allows the IC carrier to endure severe environments, e.g., the IC carrier 11 is left in a car in the hot summer weather, while ensuring, for example, sheeting properties required of the sheet frame 12.

The print layer of 6 colors 15 is formed on a required part of the upper core sheet 21a of the core sheet 21 by silk screen printing (S2). The print layer of 1 color 15 is formed on a required part of the lower core sheet 21b by silk screen printing (S1). Next, a transparent offset print was made only on a part of the upper core sheet 21a corresponding to the IC carrier by using an UV-setting ink ("KALTON OP NISU" by the Intek Kabushiki Kaisha) (S5). This offset printing part is to be the fusion preventing layer of the IC carrier 11. In this case, the fusion preventing layer 14 was formed so that the 2 mm-width peripheral part of the IC carrier 22 has a 70% halftone dot area percentage and a 40% halftone dot area percentage at the other part, e.g., the central part of the IC carrier 11.

On the other hand, the oversheets 22, 23 were provided by a 50 μm-thickness polycarbonate resin film. The oversheets 22, 23 were cut in the same size as the core sheet 21, loaded into a fusion-press, sandwiched by specular platens, and fusion-pressed under conditions of 160° C., 20 kgf/cm² and 10 minutes (S6). Thus the respective sheets 21a, 21b, 22, 23 were fusion-adhered to each other. Because polycarbonate-based resins have high fusion points, the fusion press was set at a temperature higher than 150° C. of the usual hard vinyl chloride.

Then, the fusion-adhered sheets 21a, 21b, 22, 23 were punched in a card size, and a transfer foil for a sign panel 19 was transferred to a required part of each of the punched cards (S8). The sign panel 19 is for the signature of the user of the card. Then, information (indications) 18a, 18b, such as a manufacturer's number, required bar codes, etc., were printed by thermo-transfer (S9).

Next, the IC module recess 17 for the IC module 12 to be mounted on was formed in the card by spot-facing (S10). In this case, the IC module 12 has a 0.6 mm-thickness, the recess had a 0.65 mm-thickness from the surface of the oversheet. The IC module recess 17 was formed so as to have the sectional shape, as shown in FIG. 3, having a half-cut space 17a around the IC module recess 17. This structure can mitigate external flexural stress.

To define a shape of the IC carrier 11, after the IC module recess 17 was formed, the spot-facing was performed on the side of the backside of the card (the surface opposite to the surface with the IC module 12 mounted on) to a depth which did not cut off the oversheet 22, and the sheet frame 13 and the IC carrier 11 were defined (S11).

Then, a thermo-setting adhesive was dropped into the IC module recess 17, the IC module 12 was mounted in the IC module recess 17, and the IC module was sealed (S12). IC inspections, as of functions, etc. of the IC module 12 were made (S13). Then, the telephone number, the ID number, etc. of a subscriber were inputted in the memories, and the issue processing was performed (S14).

The part where the IC carrier 11 is positioned was pressed from the surface of the IC carrier with fingers, whereby the IC carrier 11 could be readily peeled off the sheet frame 13. At this time, the fusion preventing layer 14 was left on the IC carrier 11 capably of protecting the print layer 15.

Example 2

The sheet-framed IC carrier 10 shown in FIG. 4 was produced by a the production process shown in FIG. 7. The same basic materials as in Example 1 were used. A 6-color print was made on a required part of the upper core sheet 21a by silk screen printing. A 1-color print was made on a required part of the lower core sheet 21b by silk screen printing. Next, a transparent offset print was made only on a part of the lower core sheet 21a corresponding to the IC carrier by using an UV-setting ink ("KALTON M OP NISU" by The Intek Kabushiki Kaisha), and the fusion preventing layer 14 was formed (S4). In this case, the fusion preventing layer 14 was processed so that the 3 mm-width peripheral part of the IC carrier 22 has a 70% halftone dot area percentage and a 40% halftone dot area percentage at the other part, e.g., the central part of the IC carrier 11.

Then, the steps up to the spot-facing of the IC module recess 17 for the IC module (S10) were performed in the same way as in Example 1. To define a shape of the IC carrier 11, after the IC module recess 17 was formed, the peripheral slit 13a was spot-faced on the surface of each card (the surface with the IC module 12 mounted on) to a depth which did not cut off the oversheet 23, and the sheet frame 13 and the IC carrier 11 were defined (S11). Then, a thermo-setting adhesive was dropped into the IC module recess 17, and the IC module 12 was mounted in the IC module recess 17, and the IC module was sealed (S12). IC inspections, as of functions, etc. of the IC module 12 were made (S13). Then, the telephone number, the ID number, etc. of a subscriber were inputted in the memories, and the issue processing was performed (S14).

The part where the IC carrier 11 is positioned was pressed from the surface of the IC carrier 11 with fingers, whereby the IC carrier 11 could be readily peeled off the sheet frame 13.

What is claimed is:

1. A method for producing a sheet-framed IC carrier comprising (1) a sheet frame having a core sheet, a fusion-preventing layer provided on a portion of the core sheet, and an oversheet provided on a surface of the core sheet, having the fusion-preventing layer, the sheet frame having a recess therein, the recess not including a portion of the oversheet, and (2) an IC carrier mounted in the sheet frame recess and held by the portion of the oversheet not included in the recess, the IC carrier having an IC module, the method comprising the steps of:

providing the core sheet;

forming the fusion-preventing layer on a portion of the core sheet corresponding to the IC carrier;

laying the oversheet on the fusion-preventing layer and the core sheet;

press-fusing the core sheet, fusion-preventing layer, and oversheet to form a sheet frame;

spot-facing the core sheet to form the recess in the sheet frame;

forming a peripheral slit in the core sheet to constitute a peripheral edge of the IC carrier; and mounting the IC module in the sheet frame recess.

2. The method of claim 1, further comprising providing a required print layer on the core sheet before laying the oversheet on the core sheet.

3. The method of claim 1, wherein the fusion-preventing layer is formed on a surface of the core sheet on a side of the IC module.

4. The method of claim 1, wherein the fusion-preventing layer is formed on a surface of the core sheet on an opposite side of the IC module.

5. The method of claim 1, wherein the fusion-preventing layer is formed of a solvent-free photo-setting or thermo-setting ink.

* * * * *